United States Patent
Han

(10) Patent No.: US 8,284,150 B2
(45) Date of Patent: Oct. 9, 2012

(54) SHIFT REGISTER AND ORGANIC LIGHT EMITTING DISPLAY DEVICE USING THE SAME

(75) Inventor: Sam-Il Han, Yongin (KR)

(73) Assignee: Samsung Mobile Display Co., Ltd, Gyeonggi-Do (KR)

( * ) Notice: Subject to any disclaimer, the term of this patent is extended or adjusted under 35 U.S.C. 154(b) by 568 days.

(21) Appl. No.: 12/568,521

(22) Filed: Sep. 28, 2009

(65) Prior Publication Data

US 2010/0177023 A1    Jul. 15, 2010

(30) Foreign Application Priority Data

Jan. 12, 2009  (KR) .................. 10-2009-0002232

(51) Int. Cl.
*G09G 3/36* (2006.01)
(52) U.S. Cl. ............ 345/100; 345/204; 377/64; 377/75; 377/76
(58) Field of Classification Search .............. 345/100, 345/204; 377/64, 75, 76
See application file for complete search history.

(56) References Cited

U.S. PATENT DOCUMENTS

| | | | |
|---|---|---|---|
| 2008/0062071 A1* | 3/2008 | Jeong | 345/46 |
| 2010/0073355 A1* | 3/2010 | Chun et al. | 345/213 |

FOREIGN PATENT DOCUMENTS

| | | |
|---|---|---|
| KR | 10-0610611 B1 | 8/2006 |
| KR | 10-2007-0002530 A | 1/2007 |
| KR | 10-0707617 B1 | 4/2007 |
| KR | 10-2007-0101474 A | 10/2007 |
| KR | 10-2008-0022688 A | 3/2008 |
| KR | 10-2008-0033630 A | 4/2008 |
| KR | 10-2008-0114378 A | 12/2008 |
| KR | 10-1023722 B1 | 3/2011 |

OTHER PUBLICATIONS

Korean Office Action dated Feb. 25, 2011 for Korean Patent Application No. KR 10-2009-0002232 which corresponds to the captioned application.
Korean Office Action dated Feb. 25, 2011 for Korean Patent Application No. KR 10-2009-0002649 corresponding to U.S. Appl. No. 12/568,588, filed Sep. 28, 2009, which is related to the captioned application.

* cited by examiner

*Primary Examiner* — Latanya Bibbins
(74) *Attorney, Agent, or Firm* — Knobbe Martens Olson & Bear LLP

(57) ABSTRACT

A shift register is disclosed. In one aspect, the shift register has a plurality of stages dependently coupled to an input line of a start pulse and is driven by first, second and third clock signals respectively input to first, second and third input lines. The shift register includes first and second voltage stabilizer circuits to prevent leakage currents.

20 Claims, 5 Drawing Sheets

SHIFT REGISTER AND ORGANIC LIGHT EMITTING DISPLAY DEVICE USING THE SAME

CROSS-REFERENCE TO RELATED APPLICATIONS

This application claims priority to and the benefit of Korean Patent Application No. 10-2009-0002232, filed on Jan. 12, 2009, in the Korean Intellectual Property Office, the entire content of which is incorporated herein by reference.

BACKGROUND

1. Field

The technology relates to a shift register and an organic light emitting display device using the same, and more particularly, to a shift register provided for a driving circuit driving pixel lines and an organic light emitting display device using the same.

2. Description of the Related Technology

An organic light emitting display device has a pixel array arranged in a matrix form near intersections of data and scan lines.

The pixel array is driven by a scan driving unit supplying scan signals to the scan lines and a data driving unit supplying data signals to the data lines.

The scan driving unit has a shift register that sequentially outputs scan signals to the scan lines so as to select pixels which receive a data signal supplied for each line in the pixel array.

The shift register includes stages each having a plurality of transistors. Output characteristics of the shift register are influenced by characteristics of the transistors provided in the shift register.

Particularly, when off-current characteristics of the transistors provided in the shift register are not satisfactory, the output characteristics of the shift register are unstable, and accordingly, performance of the scan driving unit may be degraded.

SUMMARY OF CERTAIN INVENTIVE ASPECTS

One aspect is a shift register comprising a plurality of serially connected stages, wherein one of the stages is connected to an input line of a start pulse, the shift register being driven by first, second and third clock signals, respectively input to first, second and third input lines. Each of the stages comprises a first transistor coupled between a first power source and an output node, the first transistor having a gate electrode coupled to a first node, a second transistor coupled between the output node and the third input line, the second transistor having a gate electrode coupled to a second node, a third transistor coupled between the first power source and the first node, the third transistor having a gate electrode coupled to an input terminal to which the start pulse or an output signal of a previous stage is input, a fourth transistor coupled between the first power source and the second node, the fourth transistor having a gate electrode coupled to the first node, a fifth transistor coupled between the first node and a second power source, the fifth transistor having a gate electrode coupled to the first input line, a first voltage stabilizer coupled to the first and second power sources, the first input line and the second node, wherein the first voltage stabilizer is configured to stabilize a voltage at the second node, a sixth transistor having one electrode coupled to the second node via the first voltage stabilizer, having another electrode coupled to the second power source, and having a gate electrode coupled to the input terminal, and a second voltage stabilizer coupled between the fourth transistor and the second node, the second voltage stabilizer being further coupled to the first and second power sources and the input terminal, wherein the second voltage stabilizer is configured to stabilize the voltage at the second node.

Another aspect is an organic light emitting display device comprising a pixel unit having a plurality of pixels positioned near intersections of scan and data lines, a data driving unit configured to apply data signals to the data lines, a scan driving unit having a shift register configured to sequentially apply scan signals to the scan lines. The shift register comprises a plurality of serially connected stages, wherein one of the stages is connected to an input line of a start pulse and is driven by first, second and third clock signals respectively input to first, second and third input lines. Each of the stages comprises a first transistor coupled between a first power source and an output node, the first transistor having a gate electrode coupled to a first node, a second transistor coupled between the output node and the third input line, the second transistor having a gate electrode coupled to a second node; a third transistor coupled between the first power source and the first node, the third transistor having a gate electrode coupled to an input terminal to which the start pulse or an output signal of a previous stage is input, a fourth transistor coupled between the first power source and the second node, the fourth transistor having a gate electrode coupled to the first node; a fifth transistor coupled between the first node and a second power source, the fifth transistor having a gate electrode coupled to the first input line; a first voltage stabilizer coupled to the first and second power sources, the first input line and the second node, wherein the first voltage stabilizer is configured to stabilize a voltage at the second node; a sixth transistor having one electrode coupled to the second node via the first voltage stabilizer, having another electrode coupled to the second power source, and having a gate electrode coupled to the input terminal; and a second voltage stabilizer coupled between the fourth transistor and the second node, the second voltage stabilizer being further coupled to the first and second power sources and the input terminal, wherein the second voltage stabilizer is configured to stabilize the voltage at the second node.

Yet another aspect is a shift register comprising a plurality of serially connected stages, wherein one of the stages is connected to an input line of a start pulse, the shift register being driven by first, second and third clock signals, respectively input to first, second and third input lines. Each of the stages comprises a first transistor coupled between a first power source and an output node, the first transistor having a gate electrode coupled to a first node, a second transistor coupled between the output node and the third input line, the second transistor having a gate electrode coupled to a second node, a third transistor coupled between the first power source and the first node, the third transistor having a gate electrode coupled to an input terminal to which the start pulse or an output signal of a previous stage is input, a fourth transistor coupled between the first power source and the second node, the fourth transistor having a gate electrode coupled to the first node, a fifth transistor coupled between the first node and a second power source, the fifth transistor having a gate electrode coupled to the first input line, first means for stabilizing a voltage at the second node, a sixth transistor having one electrode coupled to the second node via the first voltage stabilizer, having another electrode coupled to the second power source, and having a gate electrode coupled to the input terminal, and a second means for stabilizing the voltage at the second node.

BRIEF DESCRIPTION OF THE DRAWINGS

The accompanying drawings, together with the specification, illustrate exemplary embodiments, and, together with the description, serve to explain principles of the present invention.

DETAILED DESCRIPTION OF CERTAIN INVENTIVE EMBODIMENTS

Figure 1:
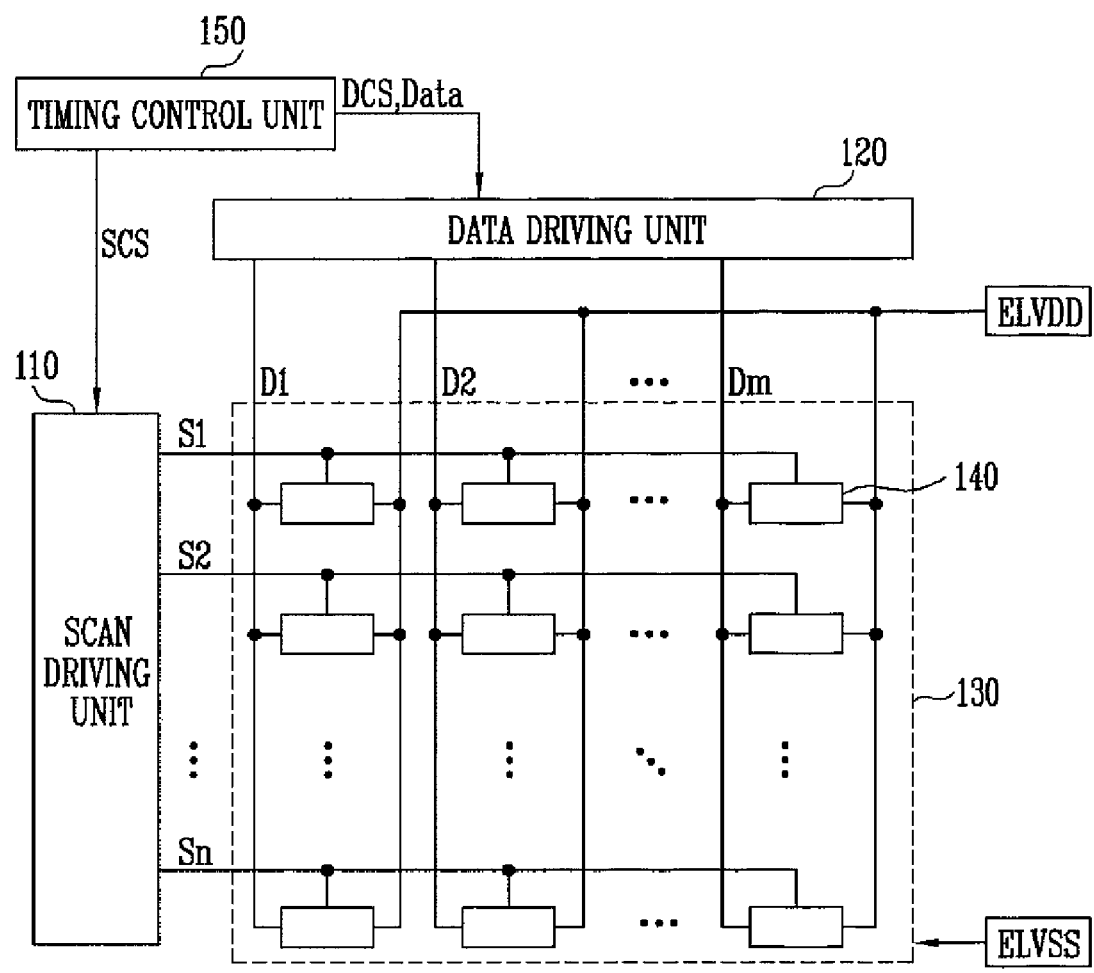
FIG. 1 is a block diagram of an organic light emitting display device according to an embodiment.

Hereinafter, certain exemplary embodiments will be described with reference to the accompanying drawings. Here, when a first element is described as being coupled to a second element, the first element may be directly coupled to the second element or may be indirectly coupled to the second element via a third element. Also, like reference numerals generally refer to like elements throughout.

FIG. 1 is a block diagram of an organic light emitting display device according to an embodiment.

Referring to FIG. 1, the organic light emitting display device includes a pixel unit 130 having pixels 140 formed in portions partitioned according to scan lines S1 to Sn and data lines D1 to Dm; a scan driving unit 110 driving the scan lines S1 to Sn; a data driving unit 120 driving the data lines D1 to Dm; and a timing control unit 150 controlling the scan driving unit 110 and the data driving unit 120.

The scan driving unit 110 receives a scan driving control signal SCS supplied from the timing control unit 150 to generate scan signals and supplies the generated scan signals to the scan lines S1 to Sn. The scan driving control signal SCS contains a start pulse SP, clock signals CLK, and the like.

To this end, the scan driving unit 110 includes a shift register that sequentially generates scan signals in response to the start pulse SP and the clock signals CLK and applies the scan signals to the scan lines S1 to Sn.

The data driving unit 120 receives a data driving control signal DCS and a data Data supplied from the timing control unit 150 to generate data signals. The data signals generated from the data driving unit 120 are supplied to the data lines D1 to Dm in synchronization with the scan signals.

The timing control unit 150 generates a scan driving control signal SCS and a data driving control signal DCS in response to synchronization signals. The scan driving control signal SCS generated from the timing control unit 150 is supplied to the scan driving unit 110, and the data driving control signal DSC generated from the timing control unit 150 is supplied to the data driving unit 120. The timing control unit 150 supplies a data Data supplied from the outside to the data driving unit 120.

The pixel unit 130 includes a plurality of pixels 140 positioned near intersections of the scan lines S1 to Sn and the data lines D1 to Dm. Each of the pixels 140 receives first and second pixel power sources ELVDD and ELVSS, and receives scan and data signals respectively supplied from the scan and data driving units 110 and 120. Each of the pixels 140, which receives the first and second pixel power sources ELVDD and ELVSS and the scan and data signals, is selected by a scan signal to receive a data signal and generates light corresponding to the data signal.

Figure 2:
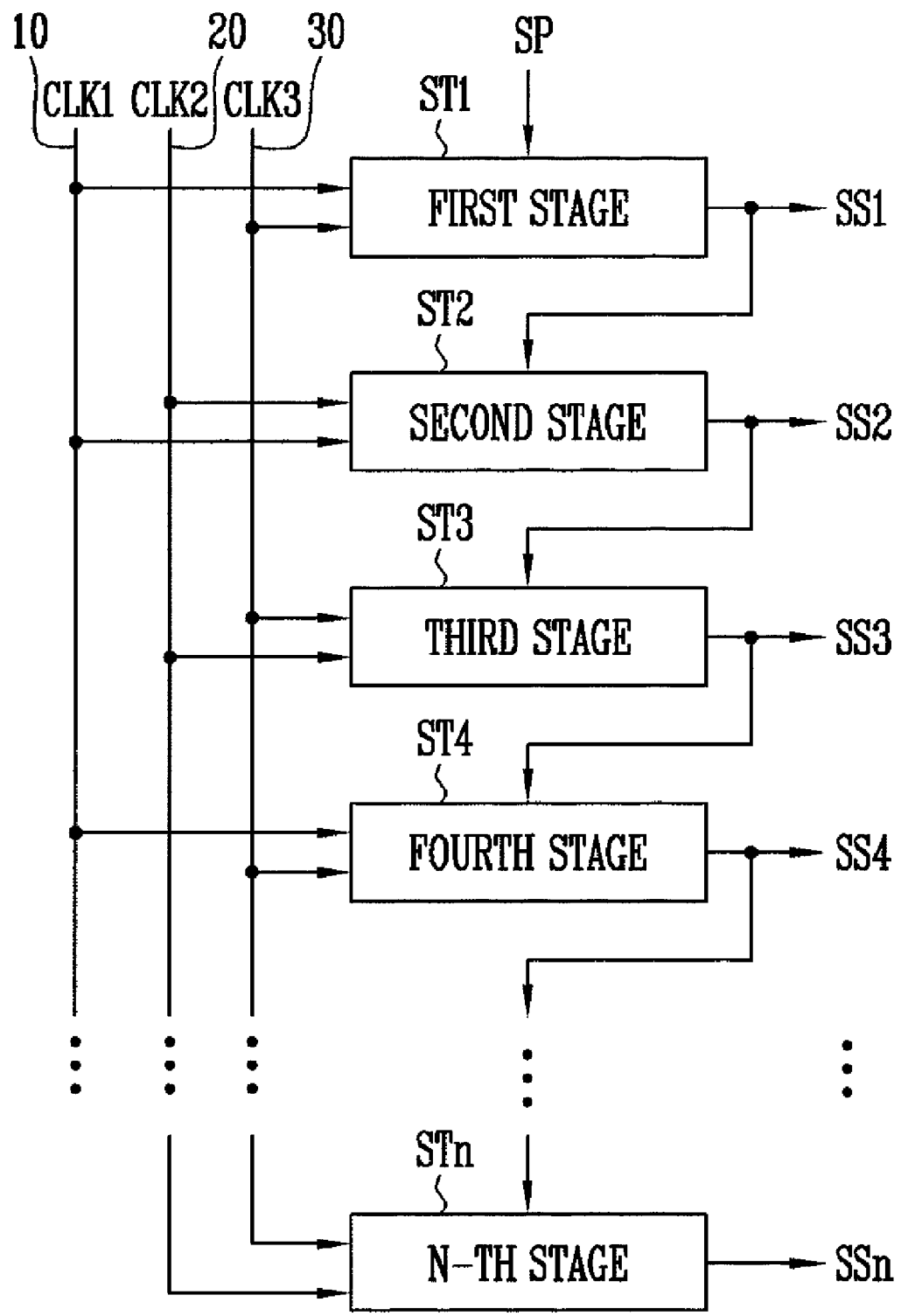
FIG. 2 is a block diagram showing an example of a shift register included in a scan driving unit of FIG. 1.

FIG. 2 is a block diagram showing an example of a shift register included in the scan driving unit of FIG. 1.

Referring to FIG. 2, the shift register includes a plurality of stages ST1 to STn dependently coupled to an input line of a start pulse SP. The shift register is driven by first, second and third clock signals CLK1, CLK2 and CLK3 respectively input from the first, second and third input lines 10, 20 and 30.

The three clock signals CLK1, CLK2 and CLK3 are configured so that their phases are sequentially delayed, and each of the stages ST is coupled to lines of two clock signals out of the three clock signals CLK1, CLK2 and CLK3. A clock signal obtained by allowing a clock signal CLK input to a previous stage to be phase-delayed is supplied to each of the next stages.

For example, when the first stage ST1 is driven with first and third clock signals CLK1 and CLK3 respectively input from the first and third input lines 10 and 30, the second stage ST2 receives second and first clock signals CLK2 and CLK1 respectively, where the second and first clock signals CLK2 and CLK1 are phase-delayed versions of the first and third clock signals CLK 1 and CLK3, respectively. Such a phase configuration is shown among CLK1, CLK2, and CLK3 of FIG. 4.

If the start pulse SP and the first, second, and third clock signals CLK1, CLK2 and CLK3 are input to the shift register, the first stage ST1 outputs a first scan signal SS1 obtained by allowing the start pulse supplied to the first stage ST1 to be phase-delayed by one clock in response to the first and third clock signals CLK1 and CLK3. The first scan signal SS1 is output through the first scan line (S1 of FIG. 1) and is also supplied to the second stage ST2.

Then, the second stage ST2 outputs a second scan signal SS2 obtained by allowing the first scan signal SS1 supplied to the second stage ST2 to be phase-delayed by one clock in response to the second and first clock signals CLK2 and CLK1. The second scan signal SS2 is output through the second scan line S2 and also supplied to the third stage ST3.

Each of the following stages ST likewise allow the start pulse or output signal (scan signal) of its previous stage to be phase-delayed by one clock, thereby sequentially outputting scan signals SS to the scan lines S.

Figure 3:
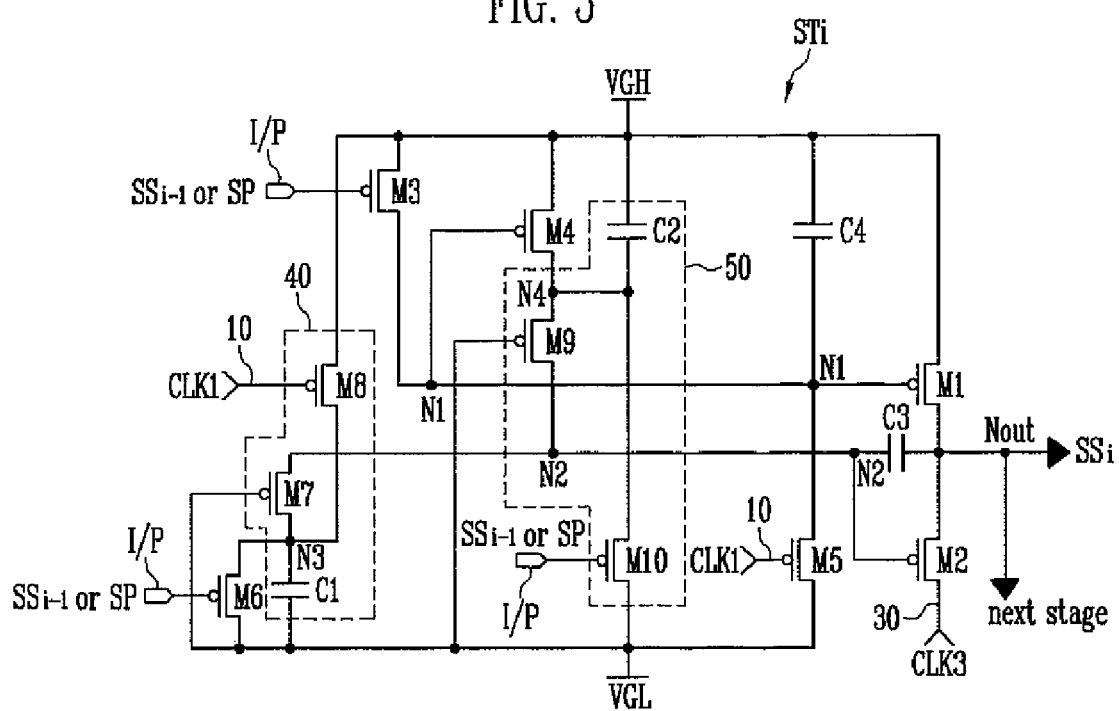
FIG. 3 is a circuit diagram showing an example of a stage of the shift register shown in FIG. 2.

FIG. 3 is a circuit diagram showing an example of a stage of the shift register shown in FIG. 2.

Referring to FIG. 3, the stage ST1 includes first to sixth transistors M1 to M6, first and second voltage stabilizers 40 and 50, and third and fourth capacitors C3 and C4.

The first transistor M1 is coupled between an output node Nout and a first power source VGH that is a gate high-level voltage source. A gate electrode of the first transistor M1 is coupled to a first node N1.

When the voltage level at the first node N1 is a low level, the first transistor M1 is turned on to allow the first power source VGH to be electrically coupled to the output node Nout. That is, when the first transistor M1 is turned on, a high-level output signal SSi is output to the output node Nout.

The second transistor M2 is coupled between the output node Nout and the input line 30 of the third clock signal CLK3. A gate electrode of the second transistor M2 is coupled to a second node N2.

When the voltage level at the second node N2 is a low level, the second transistor M2 is turned on to allow the output node Nout to be electrically coupled to the input line 30 of the third clock signal CLK3. That is, when the second transistor M2 is turned on, the waveform of the output signal SSi corresponds to that of the third clock signal CLK3.

The third transistor M3 is coupled between the first power source VGH and the first node N1. A gate electrode of the third transistor M3 is coupled to an input terminal I/P to which a start pulse SP or an output signal SSi-1 of a previous stage is input.

The third transistor M3 controls the voltage level at the first node N1 in response to the start pulse SP or the output signal SSi-1 of the previous stage.

The fourth transistor M4 is coupled between the first power source VGH and the second node N2. A gate electrode of the fourth transistor M4 is coupled to the first node N1.

The fourth transistor M4 controls the voltage level at the second node N2 corresponding to the voltage level at the first node N1. Here, the fourth transistor M4 is coupled to the second node N2 via a ninth transistor M9 of the second voltage stabilizer 50. However, while the fourth transistor M4 is turned on, the ninth transistor M9 also maintains a turned-on state. Accordingly, the voltage level at the second node N2 is controlled to be a high level by the fourth transistor M4.

The fifth transistor M5 is coupled between the first node N1 and a second power source VGL that is a gate low-level voltage source. A gate electrode of the fifth transistor M5 is coupled to the first input line 10.

The fifth transistor M5 controls the voltage level at the first node N1 in response to the first clock signal CLK1 supplied to the first input line 10.

The sixth transistor M6 is coupled between the second node N2 and the second power source VGL, and one electrode of the sixth transistor M6 is coupled to the second node N2 via a seventh transistor M7 of the first voltage stabilizer 40. A gate electrode of the sixth transistor M6 is coupled to an input terminal UP.

The sixth transistor M6 controls the voltage level at the second node N2 in response to a start pulse SP or output signal SSi-1 of a previous stage supplied to the input terminal I/P.

While the sixth transistor M6 is turned on, the seventh transistor M7 also maintains a turned-on state. Therefore, the voltage level at the second node N2 is dropped by the sixth transistor M6.

The first voltage stabilizer 40 is coupled to the first and second power sources VGH and VGL, the first input line 10 and the second node N2 so as to stabilize the voltage at the second node N2.

To this end, the first voltage stabilizer 40 includes a seventh transistor M7 coupled between the second node N2 and the sixth transistor M6 and having a gate electrode coupled to the second power source VGL; a first capacitor C1 coupled between the second power source VGL and a third node N3 that is a connection node of the sixth and seventh transistors M6 and M7; and an eighth transistor M8 coupled between the first power source VGH and the third node N3 and having a gate electrode coupled to the first input line 10.

When a low-level scan signal SSi is output to the output node Nout, the first voltage stabilizer 40 prevents leakage current from flowing between the second node N2 and the second power source VGL. Accordingly, the first voltage stabilizer 40 stabilizes the voltage at the second node N2.

The second voltage stabilizer 50 is coupled between the fourth transistor M4 and the second node N2. The second voltage stabilizer 50 is further coupled to the first and second power sources VGH and VGL and an input terminal I/P so as to stabilize the voltage at the second node N2.

The second voltage stabilizer 50 includes a ninth transistor M9 coupled between the fourth transistor M4 and the second node N2 and having a gate electrode coupled to the second power source VGL, a second capacitor C2 coupled between the first power source VGH and a fourth node N4 that is a connection node of the fourth and ninth transistors M4 and M9; and a tenth transistor M10 coupled between the fourth node N4 and the second power source VGL and having a gate electrode coupled to the input terminal I/P.

When a low-level scan signal SSi is output to the output node Nout, the second voltage stabilizer 50 prevents leakage current from flowing between the first power source VGH and the second node N2. Accordingly, the second voltage stabilizer 50 stabilizes the voltage at the second node N2.

The third capacitor C3 is coupled between the second node N2 and the output node Nout. When the voltage level of the third clock signal CLK3 is changed in the state that the second transistor M2 is turned on, the third capacitor C3 allows the voltage level at the second node N2 to be raised or dropped together with the output node Nout due to the coupling of capacitor C3.

The fourth capacitor C4 is coupled between the first power source VGH and the first node N1. That is, the fourth capacitor C4 is coupled between the gate and source electrodes of the first transistor M1 so as to stabilize the operation of the first transistor M1.

As described above, the first and second voltage stabilizers 40 and 50 are designed in each of the stages STi, so that it is possible to prevent leakage current from flowing between the first or second power source VGH or VGL and the second node N2 when a scan signal SSi is output to the output node Nout. Accordingly, while a low-level scan signal SSi is output to the output node Nout, the voltage level at the second node N2 is stabilized as a low level at which the second transistor M2 is sufficiently turned on, thereby stabilizing output characteristics of the shift register.

Hereinafter, the operation of the stage shown in FIG. 3 will be described in conjunction with waveforms of input/output signals shown in FIG. 4.

Figure 4:
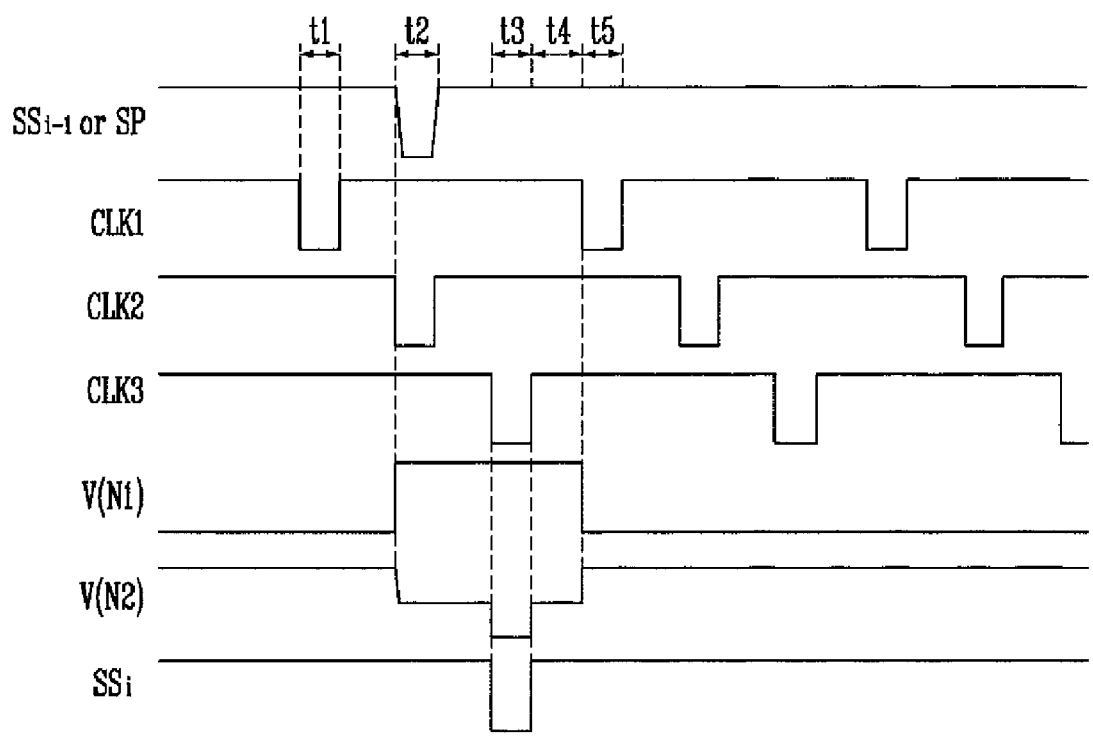
FIG. 4 is a waveform diagram showing input/output signals of the stage shown in FIG. 3.

Referring to FIG. 4, a low-level first clock signal CLK1 is first supplied to the first input line 10 during a first period t1. Accordingly, the fifth and eighth transistors M5 and M8 are turned on.

Because the fifth transistor M5 is turned on, the second power source VGL is electrically coupled to the first node N1, and the voltage V(N1) at the first node N1 becomes a low level. Accordingly, while the first transistor M1 maintains a turned-on state during the first period t1, the output signal SSi output through the output node Nout is maintained as a high level.

Because the eighth transistor M8 is turned on, the first power source VGH is electrically coupled to the third node N3, and the voltage at the third node N3 becomes a high level. The seventh transistor M7 is turned on by the voltage between the gate and source electrodes thereof, and therefore, the second node N2 is electrically coupled to the third node N3. Accordingly, during the first period t1, the voltage V(N2) at the second node N2 is maintained as a high level, and a turned-off state is maintained in the second transistor M2. As a result, a high-level voltage is charged into the first capacitor C1.

Thereafter, a low-level start pulse SP or output signal SSi-1 of a previous stage is supplied to the input terminal I/P during a second period t2. Accordingly, the third, sixth and tenth transistors M3, M6 and M10 are turned on.

Because the third transistor M3 is turned on, the first power source VGH is electrically coupled to the first node N1, and the voltage V(N1) at the first node N1 becomes a high level. Accordingly, the first and fourth transistors M1 and M4 are turned off.

Because the sixth transistor M6 is turned on, the second power source VGL is electrically coupled to the third node N3, and the voltage at the third node N3 becomes a low level.

As a result, a low-level voltage obtained by subtracting the threshold voltage of the sixth transistor M6 from the voltage at the third node N3. That is, the voltage at the third node N3 becomes a low level higher by the threshold voltage of the sixth transistor M6 than that of the second power source VGL. For example, if the voltage of the second power source VGL is −7V and the threshold voltage of the sixth transistor M6 is −3V, the voltage at the third node N3 becomes −4V.

The seventh transistor M7 maintains a turned-on state during the second period t2, so that the voltage V(N2) at the second node N2 is dropped from a high level to a low level.

Accordingly, the second transistor M2 is turned on, and therefore, the third input line 30 is electrically coupled to the output node Nout. The third clock signal CLK3 is set as a high level during the second period t2, and therefore, the output signal SSi is maintained as a high level. As a result, a voltage at which the second transistor M2 can be turned on is stored in the third capacitor C3.

Because the tenth transistor M10 is turned on, the second power source VGL is electrically coupled to the fourth node N4, and the voltage at the fourth node N4 is a low level. As a result, a voltage corresponding to the low-level voltage at the fourth node N4 is charged in the second capacitor C2.

Thereafter, when the voltage level of the third clock signal CLK3 supplied to the third input line 30 transitions to a low level during a third period t3, the voltage V(N2) at the second node N2 is dropped to a low level lower than the voltage level of the third clock signal CLK3 due to the coupling of a parasitic capacitor (not shown) of the second transistor M2 and the coupling of third capacitor C3. Accordingly, while a turned-on state is stably maintained in the second transistor M2, the low-level voltage of the third clock signal CLK3 is output to the output node Nout. That is, a low-level scan signal SSi is output during the third period t3.

The voltage V(N2) at the second node N2 is dropped to a low level lower than the voltage level of the third clock signal CLK3 during the third period t3. As a result, each of the seventh and ninth transistors M7 and M9 is turned off by the voltage between the gate and source electrodes thereof.

The seventh and ninth transistors M7 and M9 are not directly coupled to the second and first power sources VGL and VGH but coupled to the second and first power sources VGL and VGH by the first and second capacitors C1 and C2, respectively. The voltages respectively charged in the first and second capacitors C1 and C2 are, therefore, maintained during the second period t2.

When the ninth transistor M9 is coupled to the first power source VGH by the second capacitor C2, the voltage between the drain and source electrodes of the ninth transistor M9 is substantially lower than that if the ninth transistor M9 were directly coupled to the first power source VGH. For the seventh transistor M7, the voltage at the third node N3 is maintained as a low voltage between the drain and source electrodes. As a result, off-current can be prevented while turned-on and turned-off states are maintained in the seventh transistor M7 during the second and third periods t2 and t3, respectively.

Therefore, leakage current between the second node N2 and the first or second power source VGH or VGL is prevented so that the there is no influence of off-current characteristics of the transistors included in the shift register output. Particularly, off-current characteristics of the seventh and ninth transistors M7 and M9 do not influence the Output.

Accordingly, the voltage V(N2) of the second node N2 is stably maintained low during the corresponding scan period (i.e., the third period t3), thereby stabilizing output characteristics of the shift register.

Thereafter, if the voltage level of the third clock signal CLK3 supplied to the third input line 30 is transitioned to a high level during a fourth period t4, the voltage V(N2) at the second node N2 rises to a voltage level identical to that during the second period t2. Although the second transistor M2 maintains a turned-on state during the fourth period t4, the voltage level of the third clock signal CLK3 is transitioned to a high level, and therefore, the voltage of the scan signal SSi is again referred to a high level.

Thereafter, a low-level first clock signal CLK1 is again supplied to the first input line 10 during a fifth period t5. Accordingly, while the fifth and eighth transistors M5 and M8 are turned on, the voltage V(N1) at the first node N1 again becomes a low level, and the voltage V(N2) at the second node N2 again becomes a high level.

A low-level start pulse SP or output signal of the previous stage is not supplied to the stage STi until a corresponding period of a next frame. Therefore, the voltages V(N1) and V(N2) at the first and second nodes N1 and N2 are maintained.

Through the driving described above, each of the stages of the shift register according to the embodiment outputs a scan signal obtained by allowing a start pulse or output signal SSi-1 of a previous stage input to each of the stages ST to be phase-delayed by one clock in response to the first to third clock signals CLK1 to CLK3.

Particularly, according to the embodiment shown, the voltage between the drain and source electrodes of each of the transistors, i.e., the seventh and ninth transistors M7 and M9 coupled to the second node N2 is maintained low so that off-current can be prevented while a scan signal SSi is output, thereby preventing leakage current. Accordingly, the output of the shift register can be stabilized.

Meanwhile, to improve leakage current characteristics, at least one transistor on a path through which a minute leakage current is generated may be implemented as a plurality of transistors.

Figure 5:
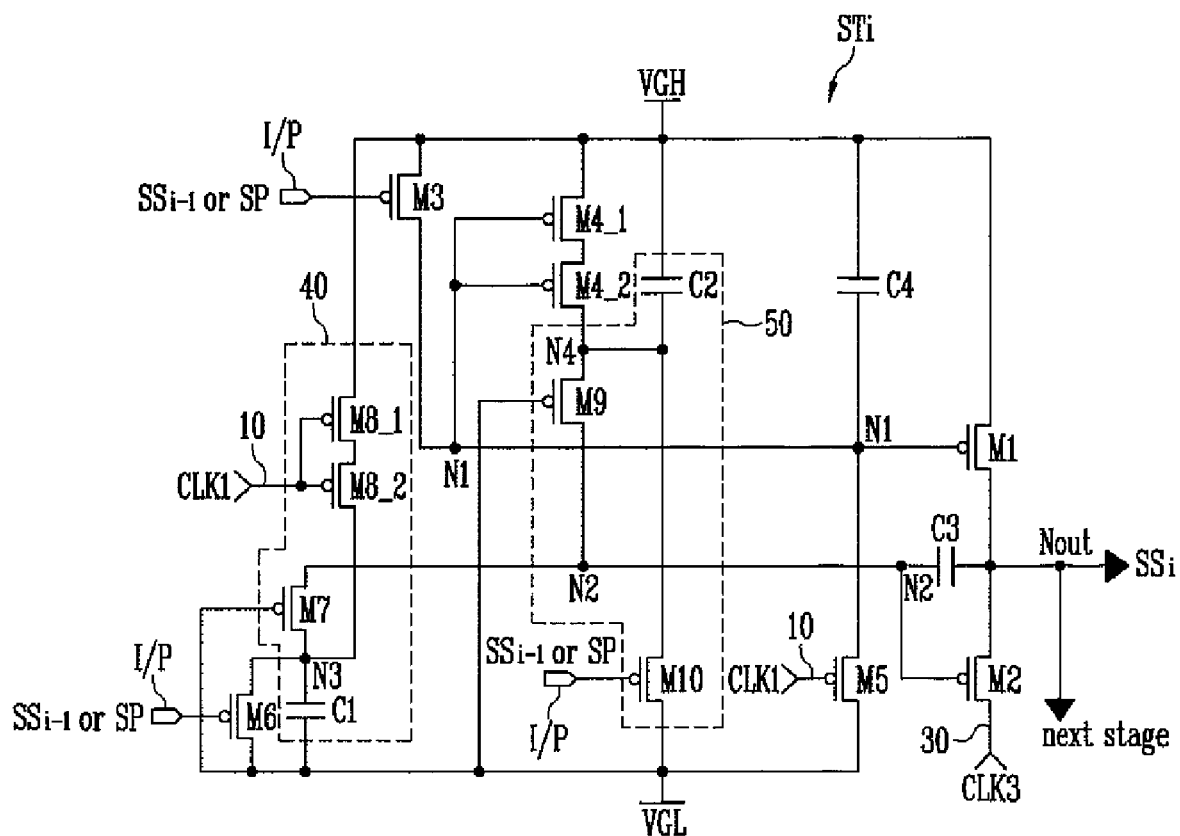
FIG. 5 is a circuit diagram showing another example of a stage of the shift register shown in FIG. 2.

For example, as shown in FIG. 5, each of the fourth and eighth transistors M4 and M8 may be implemented as a plurality of transistors.

That is, the fourth transistor M4 may be implemented as a plurality of transistors M4_1 and M4_2 that have gate electrodes commonly coupled to the first node N1 and are coupled in series to each other. The eighth transistor M8 may be implemented as a plurality of transistors M8_1 and M8_2 that have gate electrodes commonly coupled to the first input line 10 and are coupled in series to each other.

It will be apparent that such a modification may be applied to the other transistors.

While the present invention has been described in connection with certain exemplary embodiments, it is to be understood that the invention is not limited to the disclosed embodiments, but, on the contrary, is intended to cover various modifications and equivalent arrangements.

What is claimed is:

1. A shift register comprising a plurality of serially connected stages, wherein one of the stages is connected to an input line of a start pulse, the shift register being driven by first, second and third clock signals, respectively input to first, second and third input lines, wherein each of the stages comprises:

a first transistor coupled between a first power source and an output node, the first transistor having a gate electrode coupled to a first node;

a second transistor coupled between the output node and the third input line, the second transistor having a gate electrode coupled to a second node;

a third transistor coupled between the first power source and the first node, the third transistor having a gate electrode coupled to an input terminal to which the start pulse or an output signal of a previous stage is input;

a fourth transistor coupled between the first power source and the second node, the fourth transistor having a gate electrode coupled to the first node;

a fifth transistor coupled between the first node and a second power source, the fifth transistor having a gate electrode coupled to the first input line;

a first voltage stabilizer coupled to the first and second power sources, the first input line and the second node, wherein the first voltage stabilizer is configured to stabilize a voltage at the second node;

a sixth transistor having one electrode coupled to the second node via the first voltage stabilizer, having another electrode coupled to the second power source, and having a gate electrode coupled to the input terminal; and a second voltage stabilizer coupled between the fourth transistor and the second node, the second voltage stabilizer being further coupled to the first and second power sources and the input terminal, wherein the second voltage stabilizer is configured to stabilize the voltage at the second node.

2. The shift register of claim 1, wherein the first voltage stabilizer comprises:

a seventh transistor coupled between the second node and the sixth transistor, the seventh transistor having a gate electrode coupled to the second power source;

a first capacitor coupled between the second power source and a third node, wherein the sixth and seventh transistors are also connected to the third node; and an eighth transistor coupled between the first power source and the third node, the eighth transistor having a gate electrode coupled to the first input line.

3. The shift register of claim 2, wherein the eighth transistor comprises a plurality of transistors that each have gate electrodes coupled to the first input line and are coupled in series to the others of the plurality of transistors.

4. The shift register of claim 1, wherein the second voltage stabilizer comprises:

a ninth transistor coupled between the fourth transistor and the second node, the ninth transistor having a gate electrode coupled to the second power source;

a second capacitor coupled between the first power source and a fourth node, wherein the fourth and ninth transistors are also connected to the fourth node; and a tenth transistor coupled between the fourth node and the second power source, the tenth transistor having a gate electrode coupled to the input terminal.

5. The shift register of claim 1, further comprising a third capacitor coupled between the second node and the output node.

6. The shift register of claim 1, further comprising a fourth capacitor coupled between the first power source and the first node.

7. The shift register of claim 1, wherein the fourth transistor comprises a plurality of transistors that each have gate electrodes coupled to the first node and are coupled in series to one another.

8. The shift register of claim 1, wherein the first, second and third clock signals have waveforms whose phases are sequentially delayed.

9. An organic light emitting display device comprising:

a pixel unit having a plurality of pixels positioned near intersections of scan and data lines;

a data driving unit configured to apply data signals to the data lines, a scan driving unit having a shift register configured to sequentially apply scan signals to the scan lines, wherein:

the shift register comprises a plurality of serially connected stages, wherein one of the stages is connected to an input line of a start pulse and is driven by first, second and third clock signals respectively input to first, second and third input lines, and each of the stages comprises:

a first transistor coupled between a first power source and an output node, the first transistor having a gate electrode coupled to a first node;

a second transistor coupled between the output node and the third input line, the second transistor having a gate electrode coupled to a second node;

a third transistor coupled between the first power source and the first node, the third transistor having a gate electrode coupled to an input terminal to which the start pulse or an output signal of a previous stage is input;

a fourth transistor coupled between the first power source and the second node, the fourth transistor having a gate electrode coupled to the first node;

a fifth transistor coupled between the first node and a second power source, the fifth transistor having a gate electrode coupled to the first input line;

a first voltage stabilizer coupled to the first and second power sources, the first input line and the second node, wherein the first voltage stabilizer is configured to stabilize a voltage at the second node;

a sixth transistor having one electrode coupled to the second node via the first voltage stabilizer, having another electrode coupled to the second power source, and having a gate electrode coupled to the input terminal; and a second voltage stabilizer coupled between the fourth transistor and the second node, the second voltage stabilizer being further coupled to the first and second power sources and the input terminal, wherein the second voltage stabilizer is configured to stabilize the voltage at the second node.

10. The organic light emitting display device of claim 9, wherein the first voltage stabilizer comprises:

a seventh transistor coupled between the second node and the sixth transistor, the seventh transistor having a gate electrode coupled to the second power source;

a first capacitor coupled between the second power source and a third node, wherein the sixth and seventh transistors are also connected to the third node; and an eighth transistor coupled between the first power source and the third node, the eighth transistor having a gate electrode coupled to the first input line.

11. The organic light emitting display device of claim 9, wherein the eighth transistor comprises a plurality of transistors that each have gate electrodes coupled to the first input line and are coupled in series to one another.

12. The organic light emitting display device of claim 9, wherein the second voltage stabilizer comprises:

a ninth transistor coupled between the fourth transistor and the second node, the ninth transistor having a gate electrode coupled to the second power source;

a second capacitor coupled between the first power source and a fourth node, wherein the fourth and ninth transistors are also connected to the fourth node; and a tenth transistor coupled between the fourth node and the second power source, the tenth transistor having a gate electrode coupled to the input terminal.

13. The organic light emitting display device of claim 9, wherein the stage further comprises a third capacitor coupled between the second node and the output node, and a fourth capacitor coupled between the first power source and the first node.

14. The organic light emitting display device of claim 9, wherein the fourth transistor comprises a plurality of transistors that each have gate electrodes coupled to the first node and are coupled in series to one another.

15. The organic light emitting display device of claim 9, wherein the first, second and third clock signals have waveforms whose phases are sequentially delayed.

16. A shift register comprising a plurality of serially connected stages, wherein one of the stages is connected to an input line of a start pulse, the shift register being driven by first, second and third clock signals, respectively input to first, second and third input lines, wherein each of the stages comprises:

a first transistor coupled between a first power source and an output node, the first transistor having a gate electrode coupled to a first node;

a second transistor coupled between the output node and the third input line, the second transistor having a gate electrode coupled to a second node;

a third transistor coupled between the first power source and the first node, the third transistor having a gate electrode coupled to an input terminal to which the start pulse or an output signal of a previous stage is input;

a fourth transistor coupled between the first power source and the second node, the fourth transistor having a gate electrode coupled to the first node;

a fifth transistor coupled between the first node and a second power source, the fifth transistor having a gate electrode coupled to the first input line;

first means for stabilizing a voltage at the second node;

a sixth transistor having one electrode coupled to the second node via the first voltage stabilizer, having another electrode coupled to the second power source, and having a gate electrode coupled to the input terminal; and second means for stabilizing the voltage at the second node.

17. The shift register of claim 16, wherein the first stabilizing means comprises:

a seventh transistor coupled between the second node and the sixth transistor, the seventh transistor having a gate electrode coupled to the second power source;

a first capacitor coupled between the second power source and a third node, wherein the sixth and seventh transistors are also connected to the third node; and an eighth transistor coupled between the first power source and the third node, the eighth transistor having a gate electrode coupled to the first input line.

18. The shift register of claim 17, wherein the eighth transistor comprises a plurality of transistors that each have gate electrodes coupled to the first input line and are coupled in series to one another.

19. The shift register of claim 16, wherein the second stabilizing means comprises:

a ninth transistor coupled between the fourth transistor and the second node, the ninth transistor having a gate electrode coupled to the second power source;

a second capacitor coupled between the first power source and a fourth node, wherein the fourth and ninth transistors are also connected to the fourth node; and a tenth transistor coupled between the fourth node and the second power source, the tenth transistor having a gate electrode coupled to the input terminal.

20. The shift register of claim 16, further comprising a third capacitor coupled between the second node and the output node, and a fourth capacitor coupled between the first power source and the first node.

* * * * *